United States Patent
Amm et al.

(10) Patent No.: US 7,167,000 B2
(45) Date of Patent: Jan. 23, 2007

(54) CRYOGENICALLY COOLED RADIOFREQUENCY COIL ARRAY FOR MAGNETIC RESONANCE IMAGING

(75) Inventors: Kathleen Melanie Amm, Clifton Park, NY (US); Ronald Dean Watkins, Niskayuna, NY (US); William Daniel Barber, Clifton Park, NY (US); Christopher Judson Hardy, Schenectady, NY (US); Kenneth William Rohling, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 119 days.

(21) Appl. No.: 11/023,140

(22) Filed: Dec. 22, 2004

(65) Prior Publication Data

US 2006/0132134 A1   Jun. 22, 2006

(51) Int. Cl.
*G01V 3/00* (2006.01)
(52) U.S. Cl. ..................................... 324/318
(58) Field of Classification Search ................ 324/318
See application file for complete search history.

(56) References Cited

U.S. PATENT DOCUMENTS

| | | | | |
|---|---|---|---|---|
| 5,247,256 A | * | 9/1993 | Marek | 324/321 |
| 5,508,613 A | * | 4/1996 | Kotsubo et al. | 324/318 |
| 5,889,456 A | | 3/1999 | Triebe et al. | 335/300 |
| 5,913,888 A | * | 6/1999 | Steinmeyer et al. | 62/51.1 |
| 6,774,631 B2 | * | 8/2004 | Heid | 324/318 |
| 6,812,705 B1 | * | 11/2004 | Sellers | 324/318 |
| 6,825,664 B2 | * | 11/2004 | Kwok et al. | 324/318 |
| 7,015,692 B2 | * | 3/2006 | Clarke et al. | 324/300 |
| 2003/0189426 A1 | | 10/2003 | Kwok et al. | |
| 2004/0020218 A1 | * | 2/2004 | Alford | 62/6 |

FOREIGN PATENT DOCUMENTS

| | | |
|---|---|---|
| WO | 03001886 | 1/2003 |
| WO | 03087879 | 10/2003 |

OTHER PUBLICATIONS

Ma et al, Superconducting RF Coils for Clinical MR Imaging at Low Field, Acad Radiol 2003; 10:978-987.*
Wright et al, In Vivo MR Micro Imaging with Conventional Radiofrequency Coils Cooled to 77 K, Magn Reson Med 2000; 43:163-169.*

* cited by examiner

*Primary Examiner*—Diego Gutierrez
*Assistant Examiner*—Megann E Vaughn
(74) *Attorney, Agent, or Firm*—Jean K. Testa; Donald S. Ingraham

(57) ABSTRACT

A cryogenically cooled radiofrequency (RF) coil structure for use in Magnetic Resonance Imaging (MRI) and method for cryogenically cooling RF coils are provided. The cryogenically cooled RF coil structure comprises a sealed structure constructed of non-conducting material and adapted for containing a cooling substance and at least one RF coil disposed integrally in contact with the sealed structure such that sealed structure and integrally disposed RF coil are disposed about an object to be imaged.

17 Claims, 3 Drawing Sheets

CRYOGENICALLY COOLED RADIOFREQUENCY COIL ARRAY FOR MAGNETIC RESONANCE IMAGING

BACKGROUND OF THE INVENTION

The invention generally relates to magnetic resonance imaging (MRI), and, more particularly, to cryogenically cooled radiofrequency (RF) coils and RF coil arrays for use in MRI.

Generally, MRI is a well-known imaging technique. A conventional MRI device establishes a homogenous magnetic field, for example, along an axis of a person's body that is to undergo MRI. This homogeneous magnetic field conditions the interior of the person's body for imaging by aligning the nuclear spins of nuclei (in atoms and molecules forming the body tissue) along the axis of the magnetic field. If the orientation of the nuclear spin is perturbed out of alignment with the magnetic field, the nuclei attempt to realign their nuclear spins with an axis of the magnetic field. Perturbation of the orientation of nuclear spins may be caused by application of radio frequency (RF) pulses. During the realignment process, the nuclei precess about the axis of the magnetic field and emit electromagnetic signals that may be detected by one or more surface coils placed on or about the person.

Imaging time is largely a factor of desired signal-to-noise ratio (SNR) and the speed with which the MRI device can fill the k-space matrix. In conventional MRI, the k-space matrix is filled one line at a time. Although many improvements have been made in this general area, the speed with which the k-space matrix may be filled is limited. To overcome these inherent limits, several techniques have been developed to simultaneously acquire multiple lines of data for each application of a magnetic field gradient. These techniques, which may collectively be characterized as "parallel imaging techniques", use spatial information from arrays of RF detector coils to substitute for the encoding which would otherwise have to be obtained in a sequential fashion using field gradients and RF pulses. Two such parallel imaging techniques that have recently been developed and applied to in vivo imaging are SENSE (SENSitivity Encoding) and SMASH (simultaneous acquisition of spatial harmonics). Both techniques include the parallel use of a plurality of separate receiving elements, with each element having a different respective sensitivity profile, and combination of the respective spin resonance signals detected enables a reduction of the acquisition time required for an image (in comparison with conventional Fourier image reconstruction) by a factor which in the most favorable case equals the number of the receiving members used.

The effectiveness of parallel imaging depends on signal-to-noise ratio (SNR), homogeneity of magnetic field and the field-of-view (FOV) coverage. A particular drawback to many parallel imaging techniques results when the component coil sensitivities of the RF coil array are either insufficiently well characterized or insufficiently distinct from one another. These instabilities may manifest as localized artifacts in the reconstructed image, or may result in degraded SNR. SNR is defined as the ratio of signal strength of the image and background noise.

More recently, parallel imaging techniques have been further developed to exploit multiple receive channels, for example 8, 16 or 32 channels receiving signals from 8, 16 or 32 receiver coils respectively. In a typical multiple coil array arrangement, several adjacent coils are provided for receiving signals during imaging. However, there are a number of design challenges in providing the capability of multiple receive channels and multiple coils. For example, the size of coils needed to support a 32-channel MRI system must be sufficiently small to fit within a typical 40 cm field of view of a conventional MRI system, or a smaller field of view for some applications. Additionally, the coil size and corresponding arrangement within a coil array will present with inherent inductive coupling and signal-to-noise ratio (SNR) issues which both can negatively impact the quality factor (Q) and loading factor of the coils and overall performance of the coils and MRI system during imaging.

The loading factor is the ratio of unloaded Q to loaded Q (when the coil is loaded by being placed on the subject), where the quality factor Q is a measure of the coil resonance frequency divided by the width of the coil resonance. The loading factor serves as a measure of the ratio of total resistive losses arising from the coil and the imaging subject divided by the losses from the coil alone. High loading factors mean most of the noise is coming from the subject, not the coil. Therefore, the need to improve SNR becomes more important for parallel imaging applications.

Typically, an RF coil array achieves higher SNR if placed closer to the part of subject being imaged. It has been found that cooling the RF coil, such as by immersion of the RF coil in liquid cryogens such as liquid nitrogen or liquid helium or alternatively, immersing RF coils in liquid nitrogen dewars made of PVC, foam, plastic or glass, will also improve the signal-to-noise ratio by reducing resistive losses in the coil but requires careful handling because the cooled RF coils may come into close contact with the subject being imaged. Accordingly, it is desirable to implement cooled RF coils and/or coil arrays in MRI systems that (among other aspects) provide increased SNR and patient safety, particulary for use of parallel imaging technique.

Practical cryogenic cooled RF coil arrays and/or RF surface coils are also challenging to build. The relatively small space available between the coil and the patient required to obtain high quality images limits the type of insulation to a vacuum structre. The cryogen must be carefully contained inside this vacuum vessel or structure in a hermetically sealed tube or chamber in order to be thermally efficient. In most cryogenic systems, a metal tube is employeed, but this is problematic for MRI systems because the metal will interfere with the RF field of the MRI system. Similar problems exist for cryogenically cooling single RF coils employed as RF antennas in a MRI system.

Therefore, what is needed is a RF coil assembly adapted for use in a multi-channel or parallel imaging MRI system that overcomes the challenges described above.

BRIEF DESCRIPTION OF THE INVENTION

In a first aspect, a cryogenically cooled radiofrequency (RF) coil structure for use in Magnetic Resonance Imaging (MRI) is provided. The cryogenically cooled RF coil structure comprises a sealed structure constructed of non-conducting material and adapted for containing a cooling substance and at least one RF coil disposed integrally in contact with the sealed structure such that sealed structure and integrally disposed RF coil are disposed about an object to be imaged.

In a second aspect, a method for cryogenically cooling radiofrequency (RF) coils for use in Magnetic Resonance Imaging (MRI). The method comprises providing a sealed structure constructed of non-conducting material and adapted for containing a cooling substance and disposing at least one RF coil integrally in contact with the sealed structure such that the sealed structure and integrally disposed RF coil are disposed about an object to be imaged.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

Figure 1:
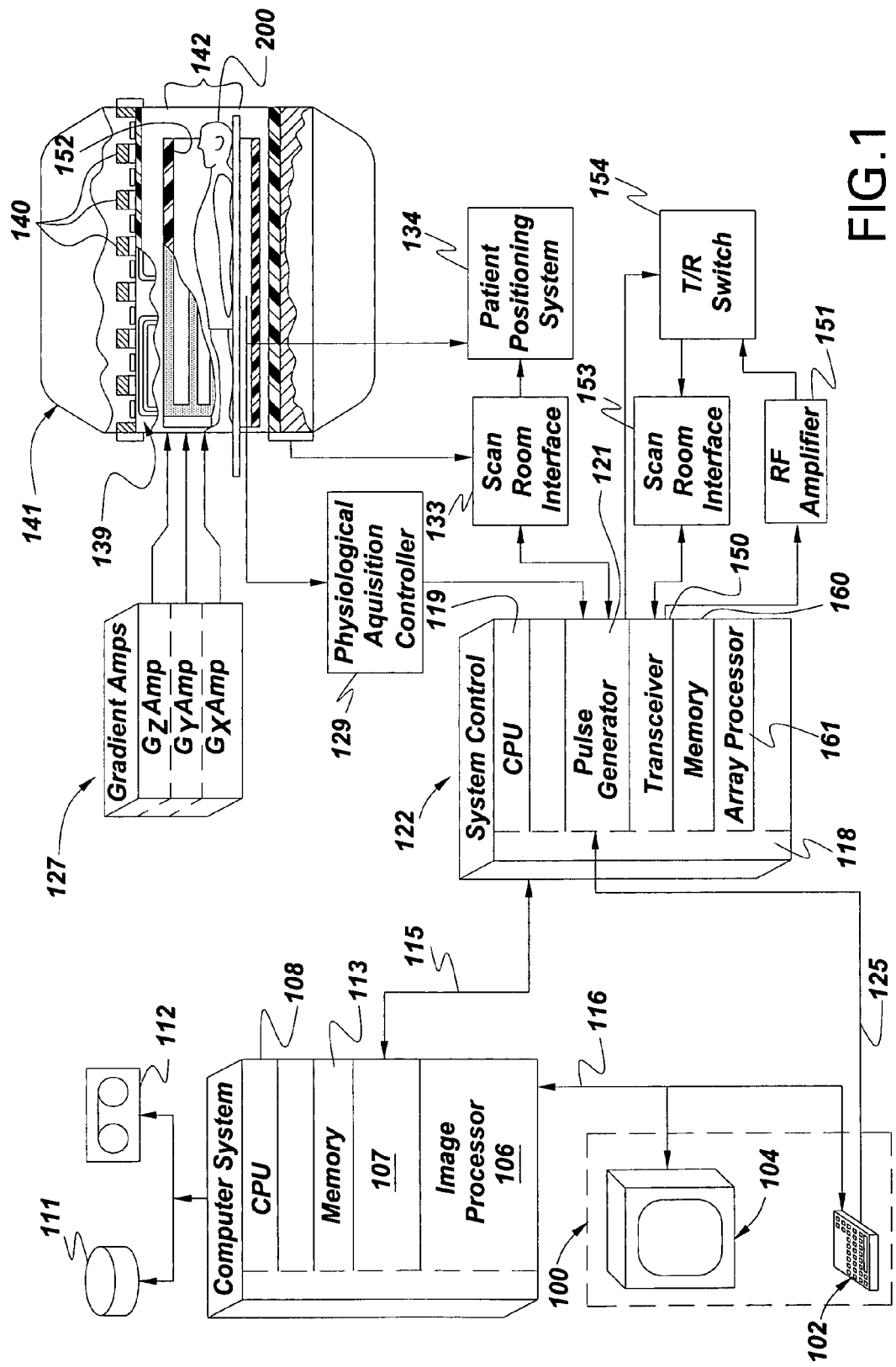
FIG. 1 is an illustration of an exemplary MRI system to which embodiments of the present invention are applicable.

FIG. 1 illustrates a simplified block diagram of a system for producing images in accordance with embodiments of the present invention. In an embodiment, the system is an MR imaging system that incorporates embodiments of the present invention. The MR system could be, for example, a GE-Signa MR scanner available from GE Medical Systems, Inc., which is adapted to perform the method of the present invention, although other systems could be used as well.

The operation of the MR system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108, and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data that indicate the timing, strength, and shape of the radio frequency (RF) pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives subject data from a physiological acquisition controller 129 that receives signals from a number of different sensors connected to the subject 200, such as ECG signals from electrodes or respiratory signals from a bellows. And finally, the pulse generator module 121 connects to a scan room interface circuit 133 which receives signals from various sensors associated with the condition of the subject 200 and the magnet system. It is also through the scan room interface circuit 133 that a positioning device 134 receives commands to move the subject 200 to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a RF coil system 152. Volume 142 is shown as the area within magnet assembly 141 for receiving subject 200 and includes a patient bore. As used herein, the usable volume of a MRI scanner is defined generally as the volume within volume 142 that is a contiguous area inside the patient bore where homogeneity of main, gradient and RF fields are within known, acceptable ranges for imaging. A transceiver module 150 in the system control 122 produces pulses that are amplified by a RF amplifier system 151 and coupled to the RF coil system 152 by a transmit/receive switch system 154. The resulting signals radiated by the excited nuclei in the subject 200 may be sensed by the same RF coil system 152 and coupled through the transmit/receive switch system 154 to a preamplifier system 153. The amplified MR signals are demodulated, filtered, and digitized in the receiver section of the transceiver 150. The transmit/receive switch 154 is controlled by a signal from the pulse generator module 121 to electrically connect the RF amplifier system 151 to the RF coil system 152 during the transmit mode (i.e., during excitation) and to connect the preamplifier system 153 during the receive mode. The transmit/receive switch system 154 also enables a separate RF coil, for example, a head coil or surface coil to be used in either the transmit or receive mode. In embodiments of the present invention, embodiments of the the separate RF coil that will be described with reference to FIGS. 2 and 3. During the transmit mode, the RF pulse waveforms produced by the pulse generator module 121 are applied to a RF amplifier system 151 comprised of multiple amplifiers. Each amplifier controls the current in a corresponding component coil of the RF coil system 152 in accordance with the amplifier's input RF pulse waveform. With the transmit/receive switch system 154, the RF coil system 152 is configured to perform transmission only, or alternatively, configured to additionally act as a receive coil array during receive mode. As used herein, "adapted to", "configured" and the like refer to mechanical or structural connections between elements to allow the elements to cooperate to provide a described effect; these terms also refer to operation capabilities of electrical elements such as analog or digital computers or application specific devices (such as an application specific integrated circuit (ASIC)) that is programmed to perform a sequel to provide an output in response to given input signals.

The MR signals picked up by the RF coil system 152 or a separate receive coil (not shown, for example, a body, head, extremety or surface coil) are digitized by the transceiver module 150 and transferred to a memory module 160 in the system control 122. When the scan is completed and an entire array of data has been acquired in the memory module 160, an array processor 161 operates to Fourier transform the data into an array of image data. These image data are conveyed through the serial link 115 to the computer system 107 where they are stored in the disk memory 111. In response to commands received from the operator console 100, these image data may be archived on the tape drive 112, or they may be further processed by the image processor 106 and conveyed to the operator console 100 and presented on the display 104. Further processing is performed by the image processor 106 that includes reconstructing acquired MR image data. It is to be appreciated that a MRI scanner is designed to accomplish field homogeneity with given scanner requirements of openness, speed and cost.

In embodiments of the present invention, a cryogenically cooled radiofrequency (RF) coil structure for use in Magnetic Resonance Imaging (MRI) is provided. The cryogenically cooled RF coil structure comprises a sealed structure constructed of non-conducting material and adapted for containing a cooling substance and at least one RF coil disposed integrally in contact with the sealed structure such that sealed structure and integrally disposed RF coil are disposed about an object to be imaged.

Figure 2:
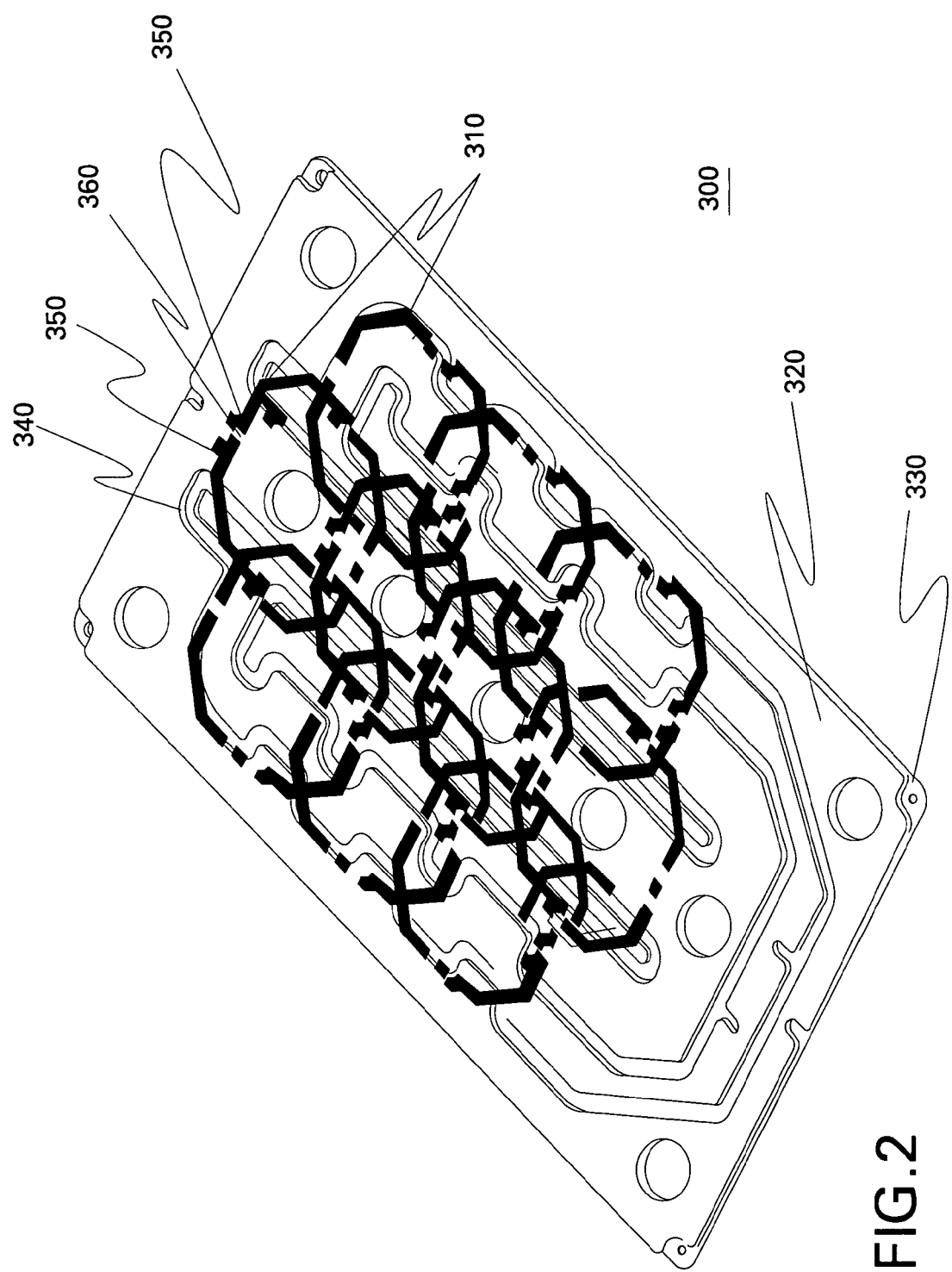
FIG. 2 is an illustration of a cryogenically cooled RF coil structure employing aspects of the present invention; and, FIG. 3 is an illustration of a cryogenically cooled RF antenna employing aspects of the present invention.

Referring to FIG. 2, there is shown an embodiment of a RF surface coil 300 employing aspects of the present invention. In this embodiment, the sealed structure comprises a ceramic substrate, shown having an upper substrate 320 and a lower substrate 330 that are to be assembled to enclose a plurality of RF coils 310 arranged in an array for use in imaging. Further, the upper substrate 320 and lower substrate 330 are sealed, preferably hermetically, to form a sealed structure that will contain a cooling fluid, such as liquid or gas. The sealed structure comprises a sealing means to maintain a sealed environment within the sealed structure. It is to be appreciated that the ceramic substrate may be formed either as a single unit, multiple units that can be attached together, or any other method to enclose the RF coils. RF surface coil 300 is shown at planar, but substrates 320 and 330 may be adapted or shaped to fit together around subject (200 FIG. 1) in a curved shape for use as a whole-body surface coil or around a particular part of a subject's anatomy such as an extremity or head. In further embodiments, the substrates may be constructed of flexible material provided the material can contain the cooling fluid and RF coils 310 in a sealed environment. At least one of substrates 320 and 330 have channels 340 thereon to permit a fluid to flow through the surface coil 300, the flow and fluid to be described in greater detail below. Referring further to FIG. 2. capacitors 350 and plated through holes 360 are provided for use in assembling an operational RF coil array in a known manner from the plurality of RF coils 310 and for attaching the RF coil to be in integral contact with the substrates 320 and 330 to form a complete structure.

In embodiments of the invention including the embodiment shown in FIG. 2, the material used in the sealed structure, such as substrates 320 and 330, comprises high thermally conductive and electrically non-conductive material. For example, the highly thermally conductive and electrically non-conductive material is selected from a group comprising ceramic, aluminum oxide, glass, or other finely divided metal-insulator mixtures. The material is further adapted to insulate the cooling substance from the subject being imaged so that the subject is not harmed from the extremely cooled temperatures of the cooling substance (not shown) that flows through the RF coil structure 300. As used herein, the term cooling substance refers to well-known reduced temperature or liquid gases and cryogens such as liquid nitrogen, liquid helium and others commonly used for their cooling properties in liquid form. The present invention may be extended to other cooling substances. Cryogenically cooled RF coil structure 300 may be coupled to a cooling subsystem (not shown) that maintains the cooling fluid and flow through the structure.

The coolant can be a cryogenically cooled gas or liquid. It can be supplied by a tank, or in a sealed system with a crycooler removing the heat. The coolant tube can be a sealed heat pipe configuration in which the coolant is recondensed by the cryocooler and then boiled off at the coil end. The coolant can also be a gas that is circulated by a pump.

Figure 3:
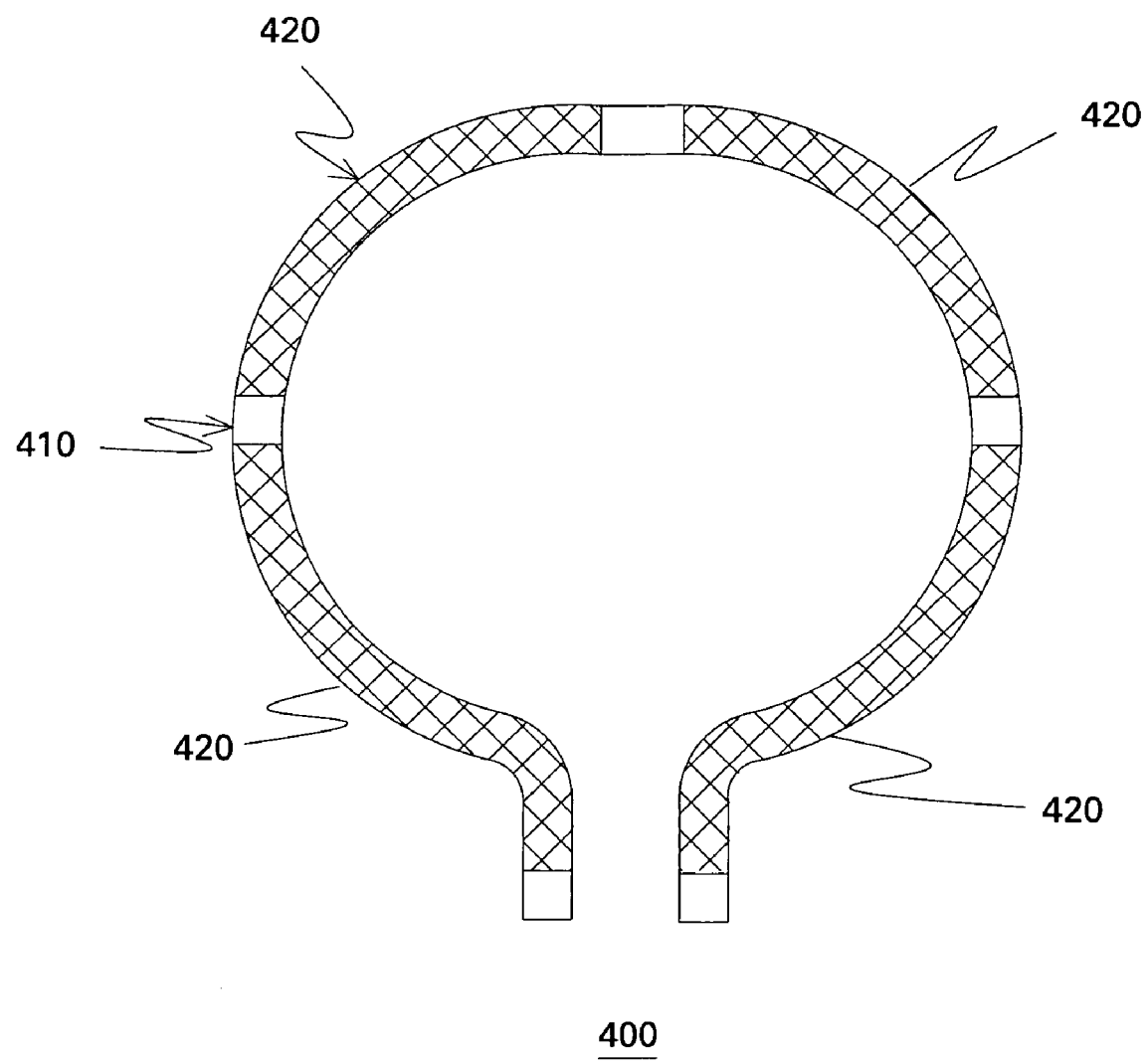

Referring to FIG. 3, there is shown another embodiment of a cryogenically cooled RF coil structure. As shown, a cryogenically cooled RF antenna 400 includes aspects of the present invention. RF antenna 400 comprises a sealed tube 410 adapted for permitting a cooling substance, as described above, to flow through the tube 410. RF antenna 400 further comprises at least one RF component to be used to receive RF signals during imaging. In the embodiment shown in FIG. 3, the RF component comprises a plurality of RF conductors 420 deposited directly in contact with tube 410. RF conductors 420 are constructed of a conductive metal suitable for use in a MRI system, for example copper, silver, or aluminum. In this embodiment, the deposition of conductive material serves to dispose the RF conductor in integral contact with the sealed structure. RF antenna 400 may be connected a cooling subsystem (not shown) that maintains the cooling fluid and flow through the structure.

A further embodiment of the present invention includes a method for cryogenically cooling radiofrequency (RF) coils for use in Magnetic Resonance Imaging (MRI). The method comprises providing a sealed structure constructed of non-conducting material and adapted for containing a cooling substance and disposing at least one RF coil integrally in contact with the sealed structure such that the sealed structure and integrally disposed RF coil are disposed about an object to be imaged. It is to be appreciated that methods and techniques described herein may be extended to various RF structures employed within a MRI system. It is also to be appreciated the methods and techniques described herein are applicable for various MRI scanning techniques including, but not limited to, full body imaging, extremity imaging, imaging at various magnetic field strengths, parallel and multiple channel imaging.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed:

1. A cryogenically cooled radiofrequency (RF) coil structure for use in Magnetic Resonance Imaging (MRI) comprising:
    a sealed structure constructed of non-conducting material, the sealed structure having at least one channel thereon wherein the channel is adapted for containing a cooling substance; and
    at least one RF coil array disposed directly in contact with the at least one channel of the sealed structure,
    wherein the sealed structure and integrally disposed RF coil array are disposed about an object to be imaged using MRI.

2. The RF coil structure of claim 1, wherein the sealed structure comprises thermally conductive and electrically non-conductive material.

3. The RF coil structure of claim 2, wherein the thermally conductive and electrically non-conductive material is selected from a group comprising ceramic, aluminum oxide, glass, or a finely divided metal-insulator mixture.

4. The RF coil structure of claim 3, wherein the sealed structure is constructed of material adapted to insulate the cooling substance from the subject being imaged.

5. The RF coil structure of claim 1, wherein the sealed structure comprises a sealing means to maintain a sealed environment within the sealed structure.

6. The RF coil structure of claim 1, wherein the sealed structure comprises at least one ceramic substrate and wherein the at least one cooling channel permits flow of the cooling substance.

7. The RF coil structure of claim 1, further comprising an attachment means for attaching the at least one RF coil array to the sealed structure.

8. The RF coil structure of claim 1, wherein the structure RF coil array is used as a surface coil array for receiving signals during MR imaging.

9. The RF coil structure of claim 1 wherein the cooling substance comprises a liquid or gas cryogen.

10. A method for cryogenically cooling radiofrequency (RF) coils for use in Magnetic Resonance Imaging (MRI) comprising:
   providing a sealed structure constructed of non-conducting material, the sealed structure having at least one channel thereon wherein the channel is adapted for containing a cooling substance; and
   disposing at least one RF coil array directly in contact with the sealed structure;
   wherein the sealed structure and integrally disposed RF coil array are disposed about an object to be imaged using MRI.

11. The method of claim 10, wherein the sealed structure comprises thermally conductive and electrically non-conductive material.

12. The method of claim 11, wherein the thermally conductive and electrically non-conductive material is selected from a group comprising ceramic, aluminum oxide, glass, or finely divided metal-insulator mixture.

13. The method of claim 12, wherein the sealed structure is further adapted to insulate the cooling substance from the subject being imaged.

14. The method of claim 10, wherein the sealed structure comprises a sealing means to maintain a sealed environment within the sealed structure.

15. The method of claim 10 wherein the sealed structure comprises at least one ceramic substrate and wherein the at least one cooling channel permits flow of the cooling substance.

16. The method of claim 10, further comprising an attachment means for attaching the at least one RF coil array to the sealed structure.

17. The method of claim 10, wherein the at least one RF coil array is used as a surface coil array for receiving signals during imaging.

* * * * *